United States Patent [19]

Noguchi et al.

[11] Patent Number: 5,381,177

[45] Date of Patent: Jan. 10, 1995

[54] CCD DELAY LINE CAPABLE OF AUTOMATIC ADJUSTMENT OF AN INPUT BIAS VOLTAGE TO CHARGE TRANSFER REGIONS

[75] Inventors: Katsunori Noguchi; Tetsuya Kondo, both of Kanagawa, Japan

[73] Assignee: Sony Corporation, Tokyo, Japan

[21] Appl. No.: 40,284

[22] Filed: Mar. 30, 1993

[30] Foreign Application Priority Data

Apr. 6, 1992 [JP] Japan .................................. 4-084170

[51] Int. Cl.[6] ........................................... H04N 5/335
[52] U.S. Cl. .................................. 348/313; 348/300; 348/316; 377/58; 377/60; 257/238
[58] Field of Search ............. 358/209, 213.11, 213.23, 358/213.29, 213.31; H04N 5/335; 377/60, 58; 257/238; 348/300, 311, 313, 316

[56] References Cited

U.S. PATENT DOCUMENTS

| 4,574,384 | 3/1986 | Murata et al. | 377/58 |
|---|---|---|---|
| 5,029,189 | 7/1991 | Sato et al. | 377/60 |
| 5,115,155 | 5/1992 | Miida et al. | 307/607 |
| 5,140,623 | 8/1992 | Imai et al. | 377/60 |
| 5,177,772 | 1/1993 | Narabu et al. | 377/60 |
| 5,210,777 | 5/1993 | Narabu et al. | 377/60 |

FOREIGN PATENT DOCUMENTS 58-36081 2/1983 Japan .............................. H04N 5/30

OTHER PUBLICATIONS

Horowitz & Hill, the Art of Electronics (2nd Edition), p. 8.

Primary Examiner—Joseph Mancuso
Assistant Examiner—Ngoc-Yen Vu
Attorney, Agent, or Firm—William S. Frommer; Alvin Sinderbrand

[57] ABSTRACT

A CCD delay line comprises of first, second and third transfer regions which are formed in a semiconductor substrate. Output portions of the second and third transfer regions are connected to a differential amplifier. The output terminal of the differential amplifier is connected to input sources of the first and second transfer regions. The third transfer region is able to carry at most 30% of maximum amount of charge which the first and second transfer regions can carry. A signal is supplied from a signal source through a clamp circuit to an input gate electrode of the first transfer region. Bias changing means independently change one of an input bias voltage supplied to the input gate electrode of the first transfer region and a reference bias voltage supplied to an input gate electrode of the second transfer region.

8 Claims, 3 Drawing Sheets

CCD DELAY LINE CAPABLE OF AUTOMATIC ADJUSTMENT OF AN INPUT BIAS VOLTAGE TO CHARGE TRANSFER REGIONS

FIELD OF THE INVENTION

The present invention relates to a CCD (Charge Coupled Device) delay line. In particular, it relates to a CCD delay line having charge transfer regions in which signal charge is transferred, and which is capable of automatic adjustment of an input DC bias voltage to the charge transfer regions.

BACKGROUND OF THE INVENTION

Recently, many CCD delay lines have been used in television receivers and other electric devices in order to delay an analog signal such as video signal. The delay line is normally supplied with an input signal while a certain input source bias voltage is applied to an input source region.

The input source bias voltage has so far been adjusted to a certain value by a variable resistor or the like provided on the outside of the delay line. Using this method of adjustment, the input source bias voltage level is subject to change according to the temperature. When the input source bias voltage level changes, the linearity of the delay line also changes. Also, adjusting the input source bias voltage to a certain value in this manner takes much time.

In order to alleviate this problem, a CCD delay line has been developed which has a bias adjusting circuit capable of automatically adjusting the input bias voltage to a certain value.

As shown in FIG. 1, a conventional CCD delay line has a first transfer region 21 (representing a first register) composed of a CCD which is formed in a semiconductor substrate (not shown) and has an input source 21a. In the first transfer region 21, signal charge is transferred. Also, second and third transfer regions 22 and 23 composed of CCDs are formed in the semiconductor substrate to constitute a bias adjusting circuit and have input sources 22a and 23a, respectively. The input source 21a of the first transfer region 21 has substantially the same structure as the input source 22a of the second transfer region 22. The first and second transfer regions 21 and 22 can carry substantially same amount of charge.

The third transfer region 23 can carry a certain portion (for example, 30%) of charge relative to the amount of charge which the first and second transfer regions 21 and 22 can carry. The third transfer region 23 is connected through the input source 23a to a DC power supply 23b. A plurality of transfer electrodes (not shown) are formed in each of the transfer regions 21, 22 and 23. The second and third transfer regions 22 and 23 have the same output structure, and have their outputs connected to a differential amplifier 24. The output of this differential amplifier is connected to the input sources 21a, 22a of the first and second transfer regions 21, 22. Moreover, a clamp circuit 25 for clamping an input signal is connected to an input gate electrode 21b of the first transfer region 21. A reference bias voltage equal to the voltage applied to the clamp circuit 25 is applied through a DC power supply E to an input gate electrode 22b of the second transfer region 22.

Upon operation of the conventional CCD delay line, the DC power supply 23b is kept at a proper voltage under which the maximum amount of charge are always transferred through the third transfer region 23. The output voltage from the third transfer region 23 is supplied to the differential amplifier 24, where it is compared with the voltage applied from the second transfer region 22. The voltage difference from the differential amplifier 24 is fed back to the input source 22a of the second transfer region 22 and to the input source 21a of the first transfer region 21. In addition, a reference bias voltage equal to the input bias voltage to the clamp circuit 25 is applied to the input gate electrode 22b of the second transfer region 22. Thus, the input source 22a supplies charge into the second transfer region 22. The output voltage from the second transfer region 22 is fed to the differential amplifier 24. Then, this operation is repeated.

In the steady state, if the maximum amount of charge which the third transfer region 23 can carry is 30% of the maximum amount of charge which the second transfer region 22 can carry, the second transfer region 22 is operating under the bias condition of 30% of its maximum amount of charge to be transferred. Since the first transfer region 21 has the same input structure and can carry the same maximum amount of charge as the second transfer region 22, the first transfer region 21 can be operated under the bias condition of 30% of its maximum amount of charge to be transferred.

The conventional CCD delay line, however, has the following problem. That is, the manufacturing process for this CCD delay line sometimes needs to change the operating point, or bias condition of the bias adjusting circuit in order to improve the characteristics. In this case, since the change of the operating point has so far been made by changing the maximum amount of charge which the third transfer region 23 can carry, the improvement cannot be confirmed in a short period of time. In other words, in order to change the maximum amount of charge which the third transfer region 23 can carry, the transfer channel width of the channel region must be changed, and for this purpose it is necessary to change the must pattern in the exposure process. Since the process for forming the channel region is performed at the initial stage of the manufacturing process, a long period of time will be taken until it is confirmed whether the operating point has been correctly changed after the change of mask pattern.

SUMMARY OF THE INVENTION

In view of the circumstances mentioned, it is an object to the present invention to provide a CCD delay line having a bias adjusting circuit which can swiftly and easily change the operating point.

In one aspect of the present invention, a CCD delay line includes a first transfer region formed in a semiconductor substrate, and in which signal charge is transferred such first transfer region having an input source, an input gate electrode and an output portion. A second transfer region is formed in the semiconductor substrate, and has an input source with a structure substantially the same as the input source of the first transfer region, an input gate electrode and an output portion. A third transfer region is formed in the semiconductor substrate, and has an input source and an output portion which is substantially the same in structure as the output portion of the second transfer region, and has maximum amount of charge which is a predetermined portion of a maximum amount of charge of the second transfer region. A plurality of transfer electrodes are formed in each of the first, second and third transfer regions. A differential amplifier detects amounts of charge of the output portions of the second and third transfer regions, and maintains amounts of charge transferred in the second transfer region and the third transfer region to be substantially equal to each other. A bias changing circuit charges relative to each other an input bias voltage supplied to the input gate electrode of the first transfer region or a reference bias voltage supplied to the input gate electrode of the second transfer region.

In accordance with the present invention, if the reference bias voltage to the input gate electrode of the second transfer region is charged by the bias changing circuit, the charges transferred in the second transfer region are increased or decreased in accordance with the applied voltage. Therefore, the reference bias voltage to the input gate electrode of the second transfer region can be adjusted. As a result, even in the first transfer region which has substantially the same input structure as the second transfer region, the output voltage relative to the input voltage is generally increased or decreased. Thus the operating point is adjusted to a designed value. In this case, since the bias changing circuit can change only the reference bias voltage to the input gate electrode of the second transfer region, the input bias voltage to the input gate electrode of first transfer region is not changed.

Moreover, since the change of wiring can be made at the final stage of the production process for the delay line, the operating point can be extremely swiftly adjusted as compared with the conventional delay line. As a result, the productivity can be increased.

Furthermore, since the operating point can be changed only by changing the wiring, various different operating points can be set with ease as compared with the conventional delay line.

BRIEF DESCRIPTION OF THE DRAWINGS

The invention will be more readily understood with reference to the accompanying drawings, wherein.

DETAILED DESCRIPTION OF THE PREFERRED EMBODIMENTS

The preferred embodiment of the present invention will be described in detail by referring to FIG. 2 and 3.

Figure 1:
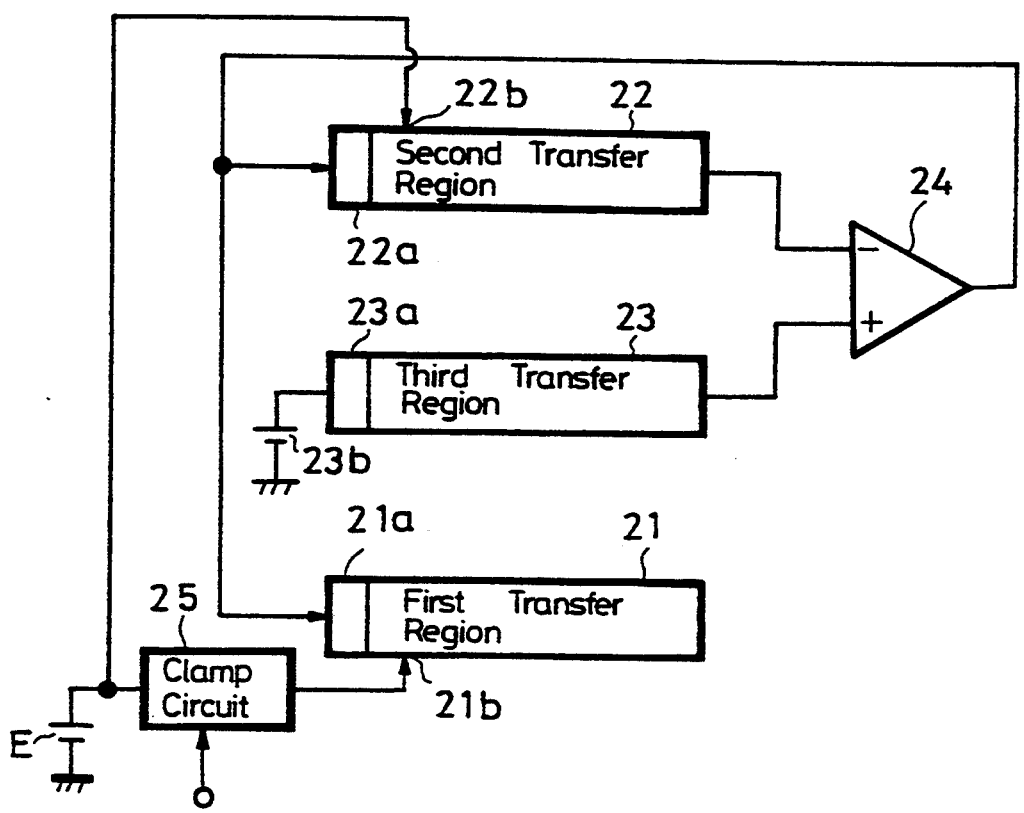
FIG. 1 is a block diagram of the construction of a conventional CCD delay line.
Figure 2:
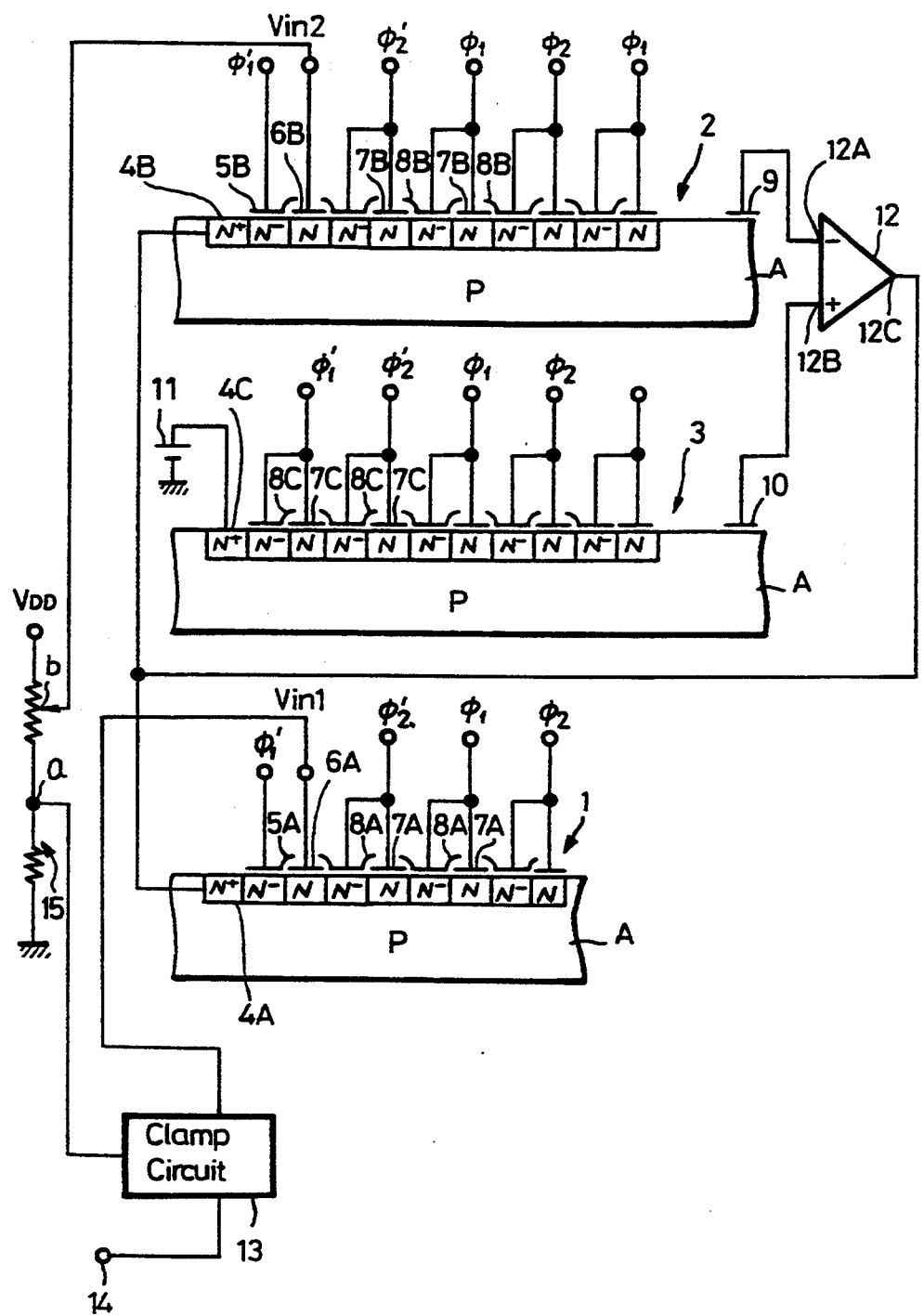
FIG. 2 is a schematic construction diagram to an embodiment representing the CCD delay line of the present invention.

As shown in FIG. 2, first, second and third transfer regions 1, 2 and 3 are formed within a P-type silicon substrate A. The regions 1, 2 and 3 have buried channel regions of N and N⁻ layers. The first and second transfer regions 1, 2 are able to carry the same maximum amount of charge, and the third transfer region 3 is able to carry at most, for example, 30% of that maximum amount of charge.

The first transfer region 1 is used as a CCD delay line to transfer signal charge. This first transfer region has an input source 4A formed at one end. The input source 4A is formed of an N+layer and has its potential well changed in depth by an applied voltage. Input gate electrodes 5A, 6A of DOPOS (DOped POlycrystalline Silicon), and a plurality of transfer electrodes 7A, 8A of first and second layers are formed on an insulating layer (not shown) which is formed on the buried channel region of first transfer region 1. The transfer electrodes 7A, 8A and the input gate electrodes 5A, 6A are electrically insulated from each other by an interlaid insulating film of $SiO_2$ (not shown). An output portion (not shown) is formed at the other end of the first transfer region.

As similarly to the first transfer region 1, the second transfer region has an input source 4B, input gate electrodes 5B, 6B of DOPOS, and a plurality of transfer electrodes 7B, 8B of first and second layers. The input gate electrode 6A of the first transfer region 1 and the input gate electrode 6B of the second transfer region 2 are formed independently from each other. The second transfer region 2 constitutes a bias adjusting circuit. The input source 4B of the second transfer region 2 is constituted by substantially the same structure as the input source 4A of the first transfer region 1. An output portion 9 is formed at the other end of the second transfer region 2 so as to convert transferred signal charge into a voltage.

The third transfer region 3 has an input source 4'C of N+layer formed at one end. A plurality of transfer electrodes 7C, 8C of first and second layers are formed on the buried channel region. An output portion 10 is formed at the other end of the third transfer region 3. The output portion 10 has is substantially the same structure as the output portion 9 of the second transfer region 2. The input source 4C of third transfer region 3 is connected to a DC power supply 11. The third transfer region 3 constitutes the bias adjusting circuit. The third transfer region 3 is able to carry, at most, about 30% of the maximum amount of charge which the first and second transfer regions 1, 2 are able to carry, by changing the channel width of the buried channel region (the width perpendicular to the charge transfer direction).

The output portion 9 of the second transfer region 2 is connected to an inverting input terminal 12A of a differential amplifier 12. The output portion 10 of the third transfer region is connected to a non-inverting input terminal 12B of the differential amplifier 12. An output terminal 12C of the differential amplifier 12 is connected to the input source 4B of the second transfer region 2 and also to the input source 4A of the first transfer region.

The input gate electrode 6A of the first transfer region 1 is connected through a clamp circuit 13 to a signal source 14. The clamp circuit 13 is connected to bias changing means 15, or connected to a mid terminal a of resistor which has one end grounded with a certain voltage applied to the other end. The input gate electrode 6B of the second transfer region 2 is also connected to the bias changing means 15, or connected to another terminal b of the resistor. In this case, the resistance values can be independently changed by changing the wiring. Thus, in this embodiment, an input bias voltage $V_{in1}$ (clamp voltage) to be applied to the input gate electrode 6A of the first transfer region 1 and a reference voltage (DC bias) $V_{in2}$ to be applied to the input gate electrode 6B of the second transfer region 2 can be changed independently from each other.

Two different-phase clock voltages $\Phi 1$ and $\Phi 2$ are supplied to the transfer electrodes 7A, 7B, 7C, 8A, 8B and 8C of the first, second and third transfer regions 1, 2 and 3. A clock pulse voltage $\Phi 2'$ which is synchronized with the clock pulse voltage $\Phi 2$ is supplied to the transfer electrodes 7A, 7B, 8A and 8B which locate the initial stage of the first and second transfer regions 1 and 2. A clock pulse voltage $\Phi 1'$ synchronized with the clock pulse voltage $\Phi 1$ is applied to the input gate electrode 5A of the first transfer region 1 and the input gate electrode 5B of the second transfer region 2.

The operation of this embodiment will be described below. First, the DC power supply 11 connected to the input source 4C of the third transfer region 3 is set to a proper voltage, thereby always supplying to the third transfer region 3 the maximum amount of charge which it is able to transfer.

A certain voltage derived from the output portion 10 of the third transfer region 3 is supplied to the differential amplifier 12, where it is compared with the voltage fed from the output portion 9 of the second transfer region 2. The voltage corresponding to the difference between these voltages is fed back to the input source 4B of the second transfer region 2 and also to the input source 4A of the first transfer region 1.

Moreover, the reference bias voltage $V_{in2}$ is supplied to the input gate electrode 6B of the second transfer region 2, thereby causing charge to be supplied from the input source 4B into the second transfer region 2. The charge is further transferred through the second transfer region 2 and produced as a voltage, which is then supplied from the output portion 9 to the differential amplifier 12.

Thereafter, this operation is repeated. In the steady state, if the maximum amount of charge which the third transfer region 3 can carry is 30% of the maximum amount of charge which the second transfer region 2 can carry, the second transfer region 2 operates under the bias condition of 30% of its maximum amount of charge to be transferred. Since the first transfer region 1 has the same input structure and can carry the same maximum amount of charge as the second transfer region 2, the first transfer region 1 can also be operated under the bias condition of 30% of its maximum amount of charge to be transferred.

Figure 3A:
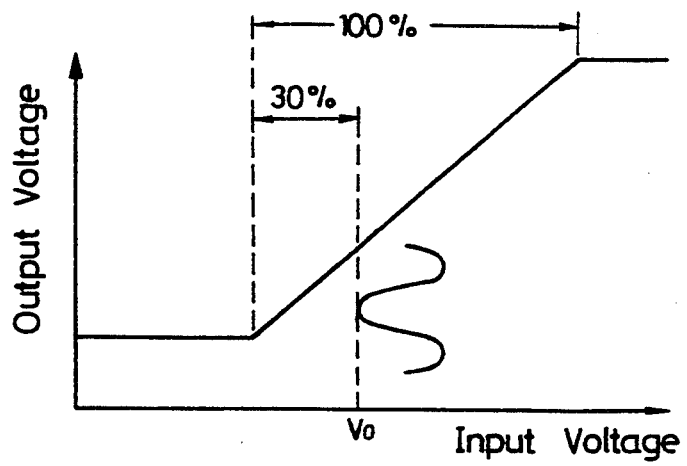
FIGS. 3(A) to 3(C) are graphs showing the relations between the input voltage and the output voltage in this embodiment.

Accordingly, in this embodiment, the first transfer region 1 can be operated in the condition that linearity of output voltage is excellent. In other words, if a sine-wave input signal is supplied from the signal source 14 through the clamp circuit 13, as shown in FIG. 3A, the signal charge can be transferred in the condition that the minimum voltage is 30% (V0) of dynamic range. This produces excellent linearity.

If the bias condition is found to be shifted from the specified value at the time of its inspection after the production of the delay line, the wiring at the terminal b of the resistor constituting the bias changing means 15 is changed for changing the reference bias voltage $V_{in2}$ which is applied to the input gate electrode 6B of the second transfer region 2. In this case, since the terminals a and b are independent, the input bias voltage $V_{in1}$ to be applied to the input gate electrode 6A of the first transfer region 1 is constant that is, the reference bias voltage $V_{in2}$ is changed independently of the input bias voltage $V_{in1}$.

Figure 3B:
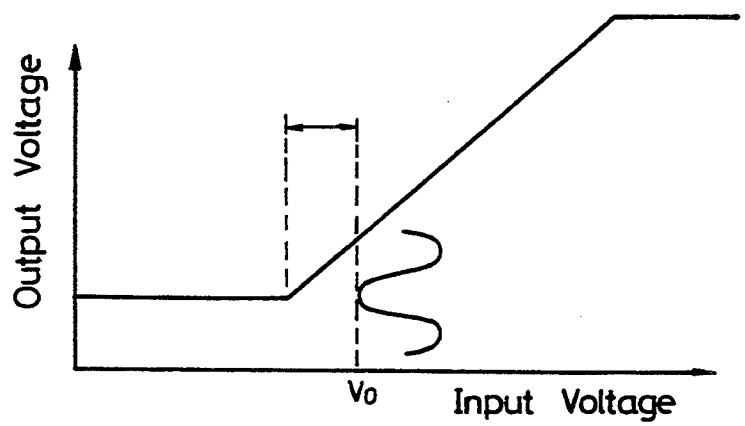
Figure 3C:
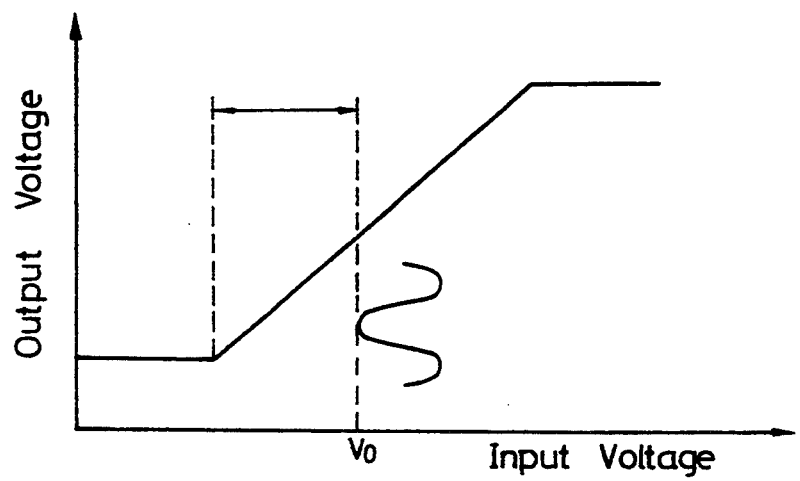

The charge transferred in the second transfer region 2 is increased or decreased in accordance with the applied voltage $V_{in2}$. As a result, the voltage fed to the differential amplifier 12 and the output voltage therefrom are also increased or decreased. So, the input source bias voltage fed to the input source 4B of the second transfer region 2 can be adjusted. Thus, the input source bias voltage according to the voltage $V_{in2}$ is also applied to the input source 4A of the first transfer region 1. Therefore, as shown in FIGS. 3B and 3C, the output voltage relative to the input voltage in the first transfer region 1 is also generally increased or decreased.

While the reference bias voltage $V_{in2}$ to be applied to the input gate electrode 6B of the second transfer region 2 is changed in the above embodiment, this invention may fix the reference bias voltage $V_{in2}$ and change the input bias voltage $V_{in1}$ to be applied to the input gate electrode 6A of the first transfer region 1.

Moreover, while in the above embodiment the bias voltage $V_{in2}$ or $V_{in1}$ is changed by changing the terminal of the resistor as the bias changing means 15, this invention may change the resistance value itself independently.

Furthermore, this invention can be applied not only to buried channel CCDs but also to surface channel CCDs.

Still more, this invention can be applied not only to CCDS having two-phase electrodes but also to CCDs having multi-phase electrodes such as three-phase electrodes.

What is claimed is:

1. A CCD delay line comprising:
    a semiconductor substrate;
    a first transfer region formed in said semiconductor substrate and in which signal charge is transferred, said first transfer region having a first input source, a first input gate electrode and a first output portion;
    a second transfer region formed in said semiconductor substrate and having a second input source with a structure substantially the same as said first input source, said second transfer region further having a second input gate electrode and a second output portion;
    a third transfer region formed in said semiconductor substrate and having a third input source, said third transfer region further having a third output portion with a structure which is substantially the same as said structure of said second output portion, and having a maximum amount of charge which is a predetermined portion of a maximum amount of charge of said second transfer region; 'a plurality of transfer electrodes formed in each of said first, second and third transfer regions;
    differential amplifier means connected with said second and third output portions for detecting amounts of charge of said second and third transfer regions, and maintaining amounts of charge transferred in said second transfer region and said third transfer region to be substantially equal to each other; and
    means for supplying an input bias voltage to said first input gate electrode and a reference bias voltage to said second input gate electrode, and including means for changing one of said input and reference bias voltages independently of the other so as to vary the output charge from said first transfer region, wherein said means for changing comprises a variable resistor.

2. A CCD delay line according to claim 1, wherein said input bias voltage is fixed and said reference bias voltage is changeable.

3. A CCD delay line according to claim 1, wherein said input bias voltage is changeable and said reference bias voltage is fixed.

4. A CCD delay line according to claim 1, further comprising a clamp circuit connected with said first input gate and said means for supplying.

5. A CCD delay line according to claim 4, wherein said clamp circuit is connected to a signal source.

6. A CCD delay line according to claim 1, wherein an output of said differential amplifier means is connected to said first input source and said second input source.

7. A CCD delay line according to claim 1, wherein said third input source is connected to a DC power supply means.

8. A CCD delay line comprising:
a semiconductor substrate;
a first transfer region formed in said semiconductor substrate and in which signal charge is transferred, said first transfer region having a first input source, a first input gate electrode and a first output portion;
a second transfer region formed in said semiconductor substrate and having a second input source with a structure substantially the same as said first input source, said second transfer region further having a second input gate electrode and a second output portion;
a third transfer region formed in said semiconductor substrate and having a third input source which is connected to a DC power supply source, said third transfer region further having a third output portion with a structure which is substantially the same as said structure of said second output portion, and having a maximum amount of charge which is a predetermined portion of a maximum amount of charge of said second transfer region;
a plurality of transfer electrodes formed in each of said first, second and third transfer regions;
differential amplifier means connected with said second and third output portions for detecting differences between the amounts of charge of said second and third transfer regions, and maintaining amounts of charge transferred in said second transfer region and said third transfer region to be substantially equal to each other;
an output of said differential amplifier means connected to said first input source and said second input source; and
means for supplying a reference bias voltage to said second input gate electrode and an input bias voltage to said first input gate electrode, said means for supplying including a resistor through which said reference bias voltage is supplied and means for changing said reference bias voltage independently of said input bias voltage so as to vary the output charge from said first transfer region, wherein said means for changing comprises a variable resistor.

* * * * *